United States Patent
Kang et al.

(10) Patent No.: US 7,883,019 B2
(45) Date of Patent: Feb. 8, 2011

(54) INTEGRATED CIRCUIT WITH EMBEDDED FERAM-BASED RFID

(75) Inventors: Hee-Bok Kang, Chungcheongbuk-do (KR); Jin-Hong Ahn, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 11/468,685

(22) Filed: Aug. 30, 2006

(65) Prior Publication Data

US 2007/0170267 A1 Jul. 26, 2007

Related U.S. Application Data

(60) Provisional application No. 60/713,828, filed on Sep. 2, 2005.

(51) Int. Cl.
*G06K 19/06* (2006.01)

(52) U.S. Cl. .............................. 235/492; 365/145; 438/3

(58) Field of Classification Search .................. 235/492; 365/145; 438/3
See application file for complete search history.

(56) References Cited

U.S. PATENT DOCUMENTS

| | | | |
|---|---|---|---|
| 5,798,964 A * | 8/1998 | Shimizu et al. ............. | 365/145 |
| 5,835,850 A * | 11/1998 | Kumar ..................... | 455/67.14 |
| 5,890,199 A | 3/1999 | Downs | |
| 5,926,110 A * | 7/1999 | Downs et al. ............ | 340/10.51 |
| 5,995,006 A | 11/1999 | Walsh | |
| 6,097,622 A | 8/2000 | Shimizu et al. | |
| 6,249,227 B1 | 6/2001 | Brady et al. | |
| 6,330,971 B1 * | 12/2001 | Mabry et al. ................ | 235/383 |
| 6,734,525 B2 * | 5/2004 | Chou et al. ................. | 257/529 |
| 6,809,541 B2 | 10/2004 | Bu et al. | |
| 6,809,952 B2 * | 10/2004 | Masui ........................ | 365/145 |
| 6,922,352 B2 * | 7/2005 | Kang ......................... | 365/145 |
| 6,962,827 B1 * | 11/2005 | Furue et al. .................. | 438/14 |
| 7,380,190 B2 * | 5/2008 | Hara et al. .................. | 714/733 |
| 2002/0149468 A1 * | 10/2002 | Carrender et al. .......... | 340/5.61 |
| 2003/0097510 A1 * | 5/2003 | Joseph ....................... | 710/305 |

(Continued)

FOREIGN PATENT DOCUMENTS

TW 490783 B 11/2002

(Continued)

OTHER PUBLICATIONS

Taiwan IPO Search Report of Taiwanese Application No. 095132452, date of mailing Dec. 29, 2009, 1 page total.

(Continued)

*Primary Examiner*—Daniel A Hess
*Assistant Examiner*—Paultep Savusdiphol
(74) *Attorney, Agent, or Firm*—Townsend and Townsend and Crew LLP

(57) ABSTRACT

An integrated circuit (IC) includes a high capacitance solid state circuit region configured to perform predetermined operations, a RFID block comprising a FeRAM block for storing data, and an interface unit configured to transfer to the RFID block an externally-provided unique ID for wirelessly identifying the IC, the unique ID being stored in the FeRAM block. The IC further includes a conductive trace extending through predetermined regions of the IC, the conductive trace being configured as an antenna for the RFID block, wherein the RFID block is configured to receive and transmit information to an external source via the antenna.

9 Claims, 9 Drawing Sheets

U.S. PATENT DOCUMENTS

| | | |
|---|---|---|
| 2003/0146771 A1 | 8/2003 | Moore |
| 2004/0185682 A1* | 9/2004 | Foulke et al. ............... 438/800 |
| 2005/0080680 A1 | 4/2005 | Elam et al. |
| 2005/0174236 A1 | 8/2005 | Brookner |
| 2005/0176373 A1 | 8/2005 | Gilbert et al. |
| 2005/0180187 A1 | 8/2005 | Koyama |
| 2005/0227627 A1* | 10/2005 | Cyr et al. ................. 455/67.11 |
| 2005/0258242 A1* | 11/2005 | Zarembo .................... 235/385 |
| 2005/0261797 A1* | 11/2005 | Cyr et al. .................... 700/121 |
| 2006/0038572 A1* | 2/2006 | Philbrook ................... 324/426 |
| 2006/0109120 A1* | 5/2006 | Burr et al. ................ 340/572.1 |
| 2006/0125505 A1* | 6/2006 | Glidden et al. .............. 324/765 |
| 2006/0125508 A1* | 6/2006 | Glidden et al. .............. 324/765 |
| 2006/0132167 A1* | 6/2006 | Chen .......................... 324/765 |
| 2006/0206277 A1* | 9/2006 | Horch ......................... 702/82 |
| 2006/0252375 A1* | 11/2006 | Wu et al. ................. 455/67.11 |

FOREIGN PATENT DOCUMENTS

| | | |
|---|---|---|
| WO | 03/054808 A2 | 7/2003 |

OTHER PUBLICATIONS

Official Action of German Patent and Trademark Office dated Apr. 22, 2008 in corresponding German Patent Appln. No. DE 11 2006 002 341.1-35 (8pp), with English translation (8pp).

* cited by examiner

| Signal | I/O | Description |
|---|---|---|
| ADD<7:0> | Input | Address from Interface controller |
| CE | Input | Chip enable signal from Interface controller |
| WE | Input | Write enable from Interface controller |
| OE | Input | Output enable from Interface controller |
| M_DATA<7:0> | InOut | 8-bit In/Out data |

US 7,883,019 B2

INTEGRATED CIRCUIT WITH EMBEDDED FERAM-BASED RFID

CROSS-REFERENCES TO RELATED APPLICATIONS

This application claims the benefit of U.S. Provisional Application No. 60/713,828, filed Sep. 2, 2005, which disclosure is incorporated by reference in its entirety for all purposes.

BACKGROUND OF THE INVENTION

The continuous market pressures to produce integrated circuits (ICs), such as memory ICs and CPUs, more cost-effectively necessitates a rapid and cost-effective way to systematically manage testing of ICs and the corresponding test results at various stages of the manufacturing process such as testing at wafer level, quality assurance (QA), and at package level, as well as maintaining inventory information at various stages. For example, if information on the test results at the wafer level is recorded for each integrated circuit and is readily accessible, efficiency at subsequent stages will be enhanced. Similarly, recordation of the test results at the next stage in turn accelerates the efficiency at subsequent stages. Thus, the general work efficiency can be greatly improved by recording the operation results at each intermediate stage and continuously updating the information at each stage.

Also, the ability to retrieve the test results as well as tracking information (e.g., fab location, manufacturing technology, year of manufacturing, wafer lot, wafer number, location of the IC on the wafer, packaging plant, type of package) recorded in each IC can be highly beneficial in aiding yield improvement efforts. Further, manufacturing semiconductor chips as value-added products has been a recent trend and, this trend will be more pronounced in the future.

Hence, there is a need for efficient and cost-effective management of information at various stages of IC manufacturing and production and beyond.

BRIEF SUMMARY OF THE INVENTION

In accordance with an embodiment of the invention, an integrated circuit (IC) includes a high capacitance solid state circuit region configured to perform predetermined operations, a RFID block comprising a FeRAM block for storing data, and an interface unit configured to transfer to the RFID block an externally-provided unique ID for wirelessly identifying the IC, the unique ID being stored in the FeRAM block. The IC further includes a conductive trace extending through predetermined regions of the IC, the conductive trace being configured as an antenna for the RFID block, wherein the RFID block is configured to receive and transmit information to an external source via the antenna.

In one embodiment, the high capacitance solid state circuit region comprises one or more of DRAM, Flash memory, FeRAM, CPU, system on chip (SoC), and ASIC.

In another embodiment, the conductive trace extends along the periphery of the IC.

In another embodiment, the RFID block includes an analog block having a demodulator circuit configured to demodulate RF signals received via the antenna and generate command signals corresponding to the received RF signals. The RFID block further includes a digital block configured to receive the command signals from the demodulator block and in response generate address and control signals coupled to the FeRAM block.

In another embodiment, the FeRAM block is configured to receive the address and command signals from the digital block and in response provide data previously stored in the FeRAM, the provided data corresponding to the RF signals received via the antenna. The analog block further includes a modulator circuit configured to modulate the data provided by the FeRAM block and generate signals to be transmitted to the external source via the antenna.

In another embodiment, the FeRAM block is configured to receive the address and command signals from the digital block and in response provide data previously stored in the FeRAM, the provided data corresponding to the RF signals received via the antenna. The analog block further includes a modulator circuit configured to modulate the data provided by the FeRAM block and generate signals to be transmitted to the external source via the antenna.

In another embodiment, the RFID block includes an analog block having a demodulator circuit configured to demodulate RF signals received via the antenna and generate command signals corresponding to the received RF signals. The RFID further includes a digital block configured to receive the command signals from the demodulator block and in response generate address, data and control signals coupled to the FeRAM block.

In another embodiment, the FeRAM block is configured to receive the address, data and command signals from the digital block and in response store the received data in memory locations corresponding to the received address.

In another embodiment, the RFID block further includes a voltage multiplier circuit configured to convert RF signals received via the antenna to a supply voltage for powering the RFID block.

In another embodiment, the RFID block further includes a power on reset circuit configured to detect the supply voltage and power up the RFID block when the supply voltage reaches a predetermined level.

In another embodiment, the FeRAM block includes a control circuit configured to receive control signals and to determine whether the control signals correspond to a read operation or a write operation, a memory array comprising a plurality of FeRAM cells arranged along rows and columns, a decoder coupled to the memory array and configured to select FeRAM cells in response to address signals received by the FeRAM block, sense amplifiers coupled to the memory array and configured to sense data stored in the selected FeRAM cells in a read operation, and I/O buffers configured to transfer data received by the FeRAM unit to the memory array in a write operation and to output the sensed data in a read operation.

In another embodiment, FeRAM cells along each column are connected to a bitline, and each FeRAM cell comprises a transistor and a FeRAM capacitor serially connected between a bitline and a plate line PL, the transistors in FeRAM cells along a row having their gates coupled to a wordline.

In another embodiment, the IC of further includes a built-in self-test (BIST) block configured to carry out testing of the IC when prompted to do so, and a BIST interface unit coupled between the RFID block and the BIST unit. The BIST interface unit is configured to supply commands generated by the RFID block to the BIST block, and to transfer test results from a BIST operation to the RFID block.

In accordance with another embodiment of the invention, a method for wireless exchange of information with IC dies each of which includes a RFID block and an antenna to enable wireless communication with the IC die, is as follows. A unique identification code is stored in each of the IC dies. Each IC die is tested, and at least part of the test results is stored in the corresponding IC die. The unique identification code stored in each IC die together with the RFID block and the antenna of each IC die enable wireless retrieval of the test results stored in each IC die.

In one embodiment, the unique identification code stored in each IC die together with the RFID block and the antenna of each IC die enable wireless retrieval of the test results from each IC die after each IC die is packaged.

In another embodiment, the unique identification code stored in each IC die together with the RFID block and the antenna of each IC die enable wireless retrieval of the test results from each IC die before each IC die is packaged.

In another embodiment, the testing of the IC dies is carried when the IC dies are on a semiconductor wafer so that the test results correspond to wafer test.

In another embodiment, the testing of the IC dies is carried after the IC dies are packaged so that the test results correspond to package test.

In another embodiment, using the unique identification code for each IC die, the test results stored in each IC die are wirelessly retrieved.

In another embodiment, using the unique identification code for each IC die, the test results are wirelessly stored in corresponding IC dies.

In another embodiment, each IC die includes an interface unit coupled to the RFID block, wherein the test results are stored in the RFID block of corresponding IC dies via their respective interface unit.

In another embodiment, each IC die comprises an interface unit coupled to the RFID block, wherein each unique identification code is stored in the RFID block of the corresponding IC die via the interface unit.

In another embodiment, the test results correspond to one or more of wafer test results, quality assurance test results, and package test results.

In another embodiment, tracking information is stored in each IC die, the tracking information identifying one or more of: manufacturing plant in which the IC die is manufactured, process technology used to manufacture the IC die, wafer lot to which the IC die belongs, the location of the IC die on a wafer from which the IC die is extracted, type of package in which the IC die is housed, packaging plant in which the IC die is packaged. The unique identification code stored in each IC die together with the RFID block and the antenna of each IC die enables wireless retrieval of the tracking information stored in each IC die.

In accordance with another embodiment of the invention, a method for increasing use efficiency of packaged IC dies each of which includes a RFID block and an antenna to enable wireless communication with the IC die, is as follows. Prior to packaging the IC dies, a unique identification code is stored in each of the IC dies, wherein the unique identification code stored in each IC die together with the RFID block and the antenna of each IC die enable wireless disabling of a defective portion of a packaged IC die so that a remaining functional portion of the packaged IC die can be used.

In another embodiment, using the unique identification code for each IC die, only the defective portion of the packaged IC die is wirelessly disabled so that a remaining functional portion of the packaged IC die can be used.

In another embodiment, using the unique identification code for each IC die, the defective portion of the packaged IC die is wirelessly identified.

In another embodiment, each IC die comprises an interface unit and a RFID block coupled to one another, wherein each unique identification code is stored in the RFID block of the corresponding IC die via the IC die's interface unit.

A further understanding of the nature and the advantages of the invention disclosed herein may be realized by reference to the remaining portions of the specification and the attached drawings.

DETAILED DESCRIPTION OF THE INVENTION

In accordance with an embodiment of the invention, a solid state semiconductor IC includes a high capacitance circuitry portion configured to perform one or more functions such as those performed by conventional DRAMs, Flash memories, SRAMs, ASICs, FPGAs, analog ICs, data processors (e.g., CPUs or graphics processors), and system on chip (SoC). The solid state IC further includes a RFID block, an interface unit configured to provide wired access to the RFID block, and an embedded antenna configured to provide wireless access to the RFID block. The RFID block is configured to store information using ferroelectric memory technology (FeRAM). The interface unit is used when data is directly transferred to or from the RFID block via IC pins. In one embodiment, a metal layer routed along the peripheral region of the IC serves as the embedded RF antenna for wireless communications.

During the manufacturing process, the RFID block in each IC die on a wafer can be used to record a variety of information such as the results of tests performed on the die itself, statistical or yield information about the wafer and the wafer lot to which the particular die belongs. This helps improve efficiency of subsequent processes. Similarly, the results of operations carried out after the wafer level test (such as in QA or package testing) can be recorded in the RFID block, thus further enhancing efficiency in subsequent processes. In this manner, each IC carries a record of the results from various stages of the manufacturing process which can be easily accessed, thus significantly improving the work efficiency.

Figure 1:
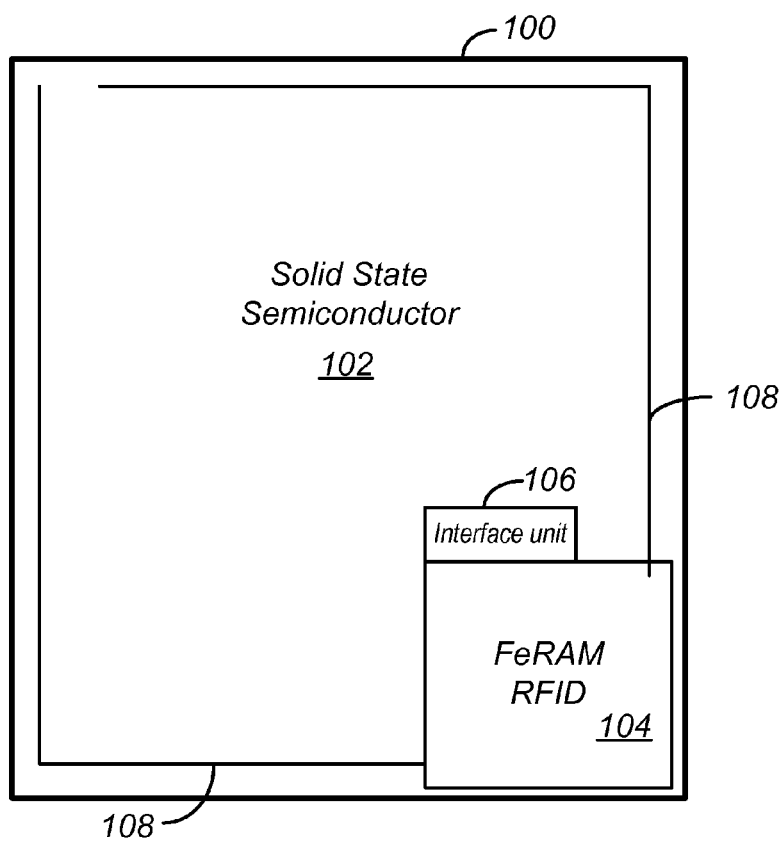
FIG. 1 is a top view diagram of a solid state semiconductor IC with an embedded FeRAM-based RFID block in accordance with an embodiment of the invention.

FIG. 1 is a top view diagram of a solid state semiconductor IC 100 with an embedded FeRAM-based RFID block 104 in accordance with an embodiment of the invention. The solid state semiconductor IC 100 may include any type of known circuitry used in various electronic applications. The IC further includes an RFID block 104 which includes a FeRAM memory for storing data. As compared to other memory technologies, FeRAM technology can be integrated with any process technology, such as CMOS, bipolar and the like, with little to no additional process overhead. Also, FeRAM consumes least amount of silicon area while providing high FeRAM capacitance, consumes low power, and is more suitable for long distance wireless communication. Additionally, in many of the ICs depicted by FIGS. 2-7 as well as other types of ICs, high capacitance value capacitors are needed for various purposes, such as for charge pump circuits, power reservoir capacitors, analog circuits, and the like. The FeRAM capacitor provides the highest capacitance value for the same unit area compared to other commonly used capacitors such as poly-insulator-poly (PIP) capacitor and metal-insulator-metal (MIM) capacitors, and adds minimal to no complexity to the process technology. In another technique, the FeRAM capacitor used in analog CMOS circuits is advantageously stacked on top of the analog CMOS circuit, thus consuming no additional silicon area. Thus, FeRAM is the most cost-effective and practical memory type for implementing the RFID block in many types of ICs.

In FIG. 1, an interface unit 106 serves as a communication channel between RFID block 104 and the other circuitry 102 on the IC. Interface unit 106 may be used to provide direct external access to RFID block 104. The interface unit may be coupled to external pins of the package in which IC 100 is housed. The external pins may be dedicated to the RFID function or alternatively the pins used for accessing the IC circuitry 102 may be configured to also serve as means for accessing the RFID block. Metal traces 108 extending along the periphery of the IC serves as the RF antenna for wireless communication with RFID block 104. Material which serves well as an RF antenna may be used instead of or in conjunction with metal. Note that the location of the various blocks and lines as shown in FIG. 1 are merely illustrative and not to scale. Further, the location of RFID block 104 is not limited to the particular corner of the IC shown in FIG. 1, and may be formed in any part of the IC as necessitated by such factors as layout and die size efficiency. The RFID block and the interface block would typically consume a small percentage of the total die size.

Figure 2:
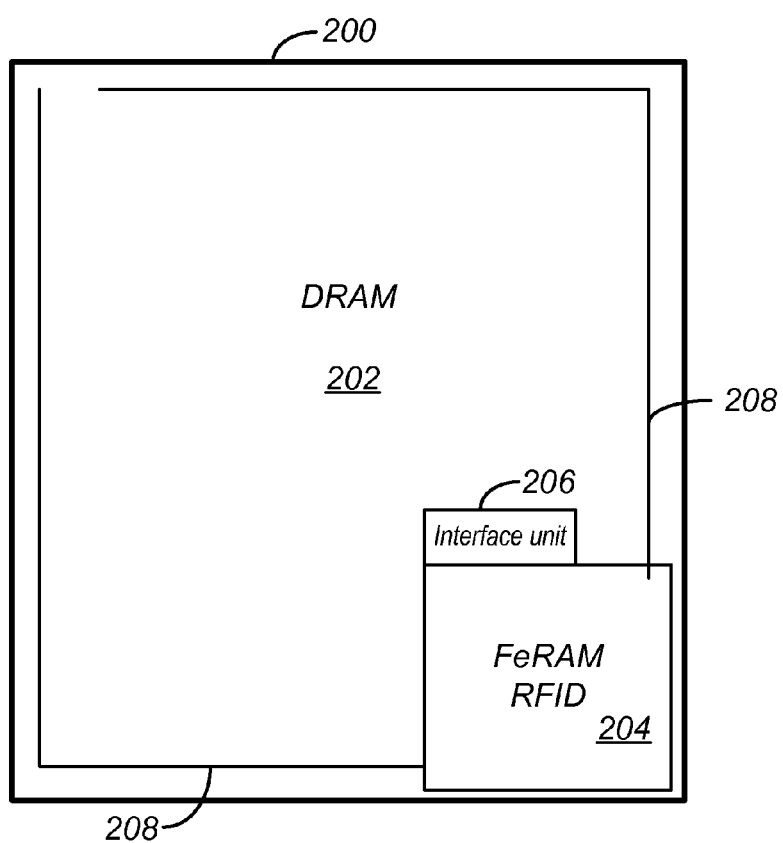
FIGS. 2-7 are top views of various types of ICs in which a FeRAM-based RFID block and its associated antenna are embedded in accordance with exemplary embodiments of the present invention.
Figure 3:
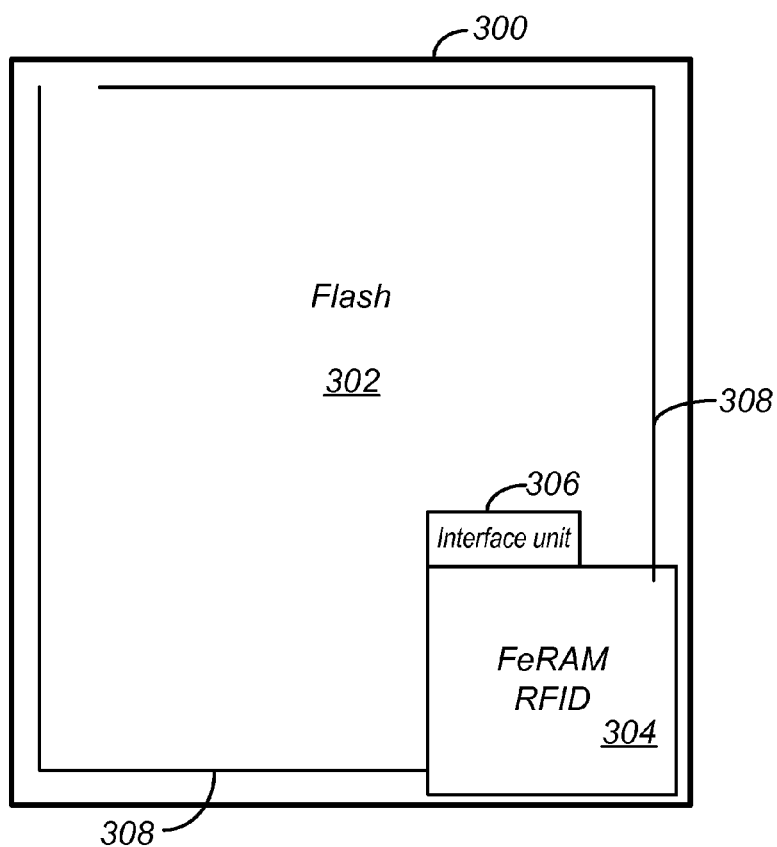
Figure 4:
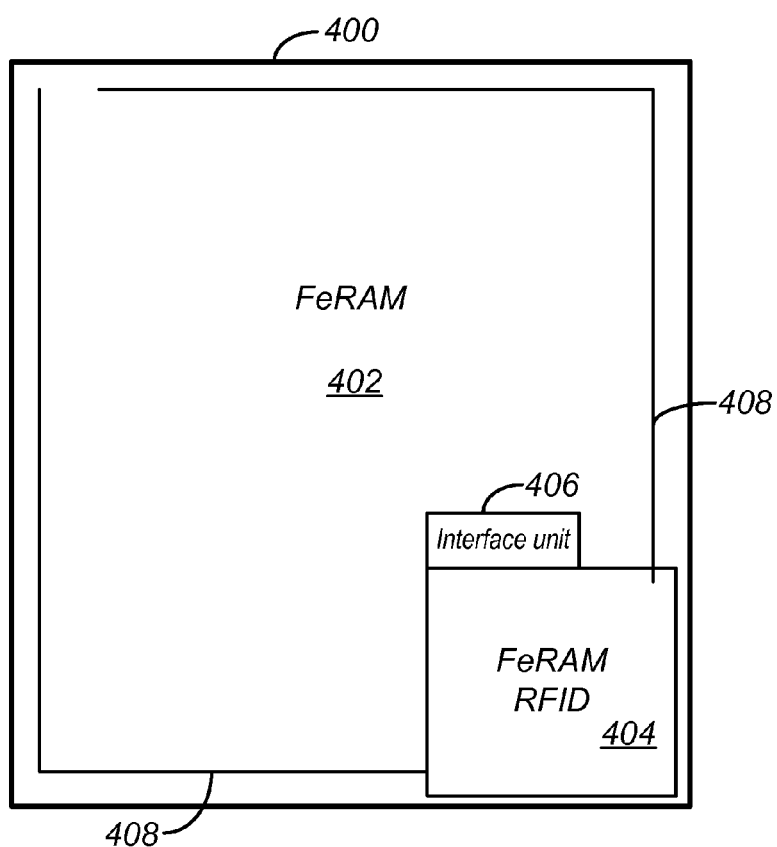
Figure 5:
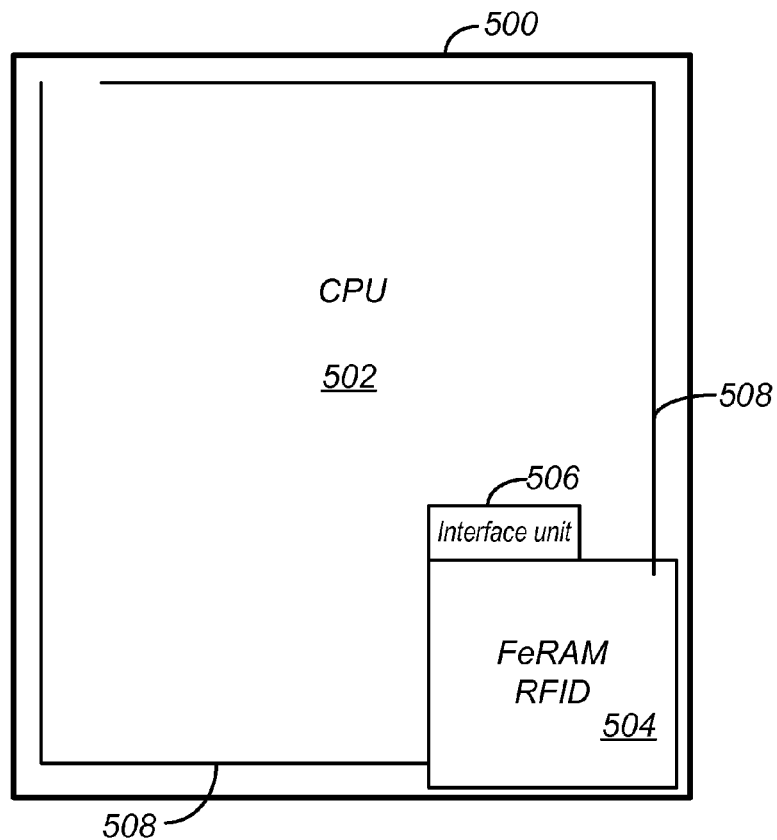
Figure 6:
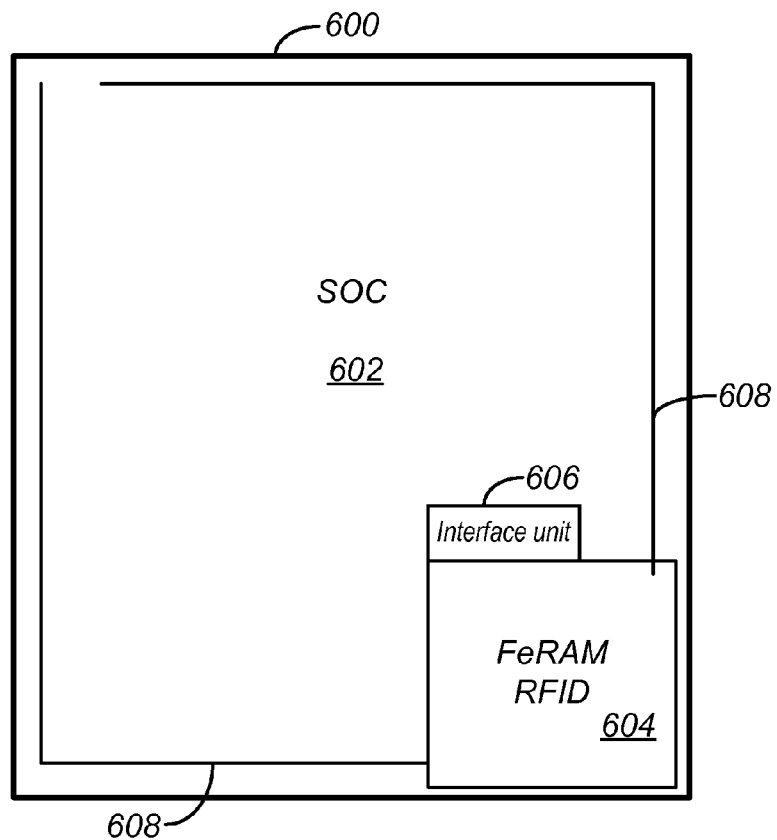
Figure 7:
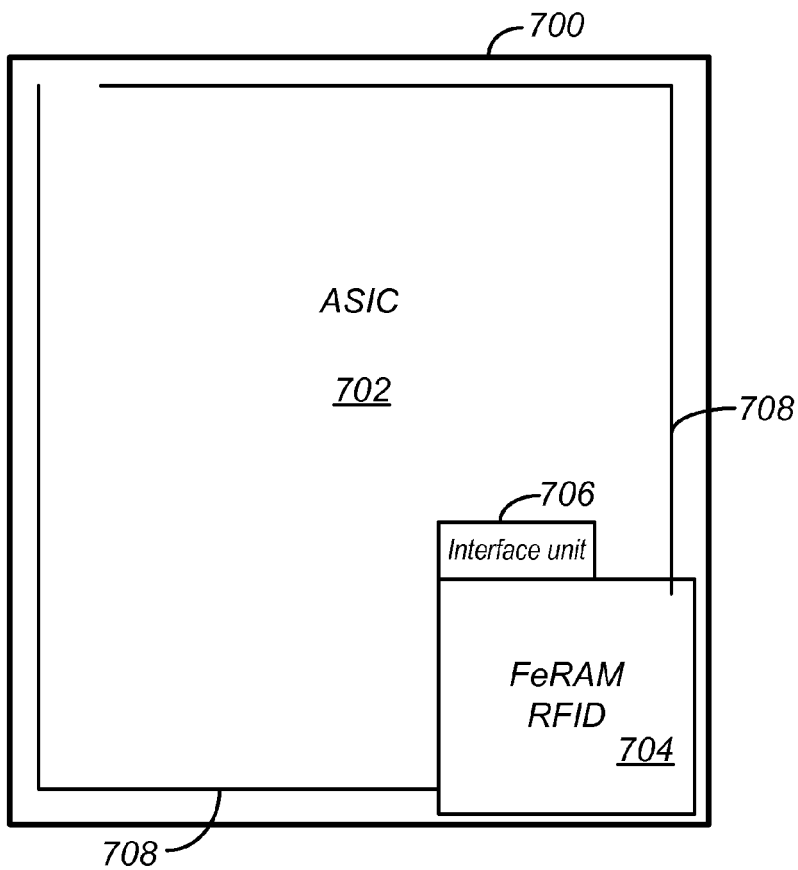

FIGS. 2-7 are top views of various types of ICs in which a FeRAM-based RFID block and its associated antenna are embedded in accordance with embodiments of the present invention. These figures are merely exemplary. Many other types of ICs in which the RFID block and its antenna can be embedded can be envisioned by one skilled in this art in view of this disclosure. FIG. 2 shows a DRAM IC 200 in which the FeRAM-based RFID block 204 and its associated antenna 208 are embedded. FIG. 3 shows a Flash memory IC 300 in which the FeRAM-based RFID block 304 and its associated antenna 308 are embedded. FIG. 4 shows a FeRAM memory IC 400 in which the FeRAM-based RFID block 404 and its associated antenna 408 are embedded. FIG. 5 shows a CPU IC 500 in which the FeRAM-based RFID block 504 and its associated antenna 508 are embedded. FIG. 6 shows a system-on-chip (SoC) IC 600 in which the FeRAM-based RFID block 604 and its associated antenna 608 are embedded. FIG. 7 shows an application specific IC (ASIC) 700 in which the FeRAM-based RFID block 704 and its associated antenna 708 are embedded.

Figure 8:
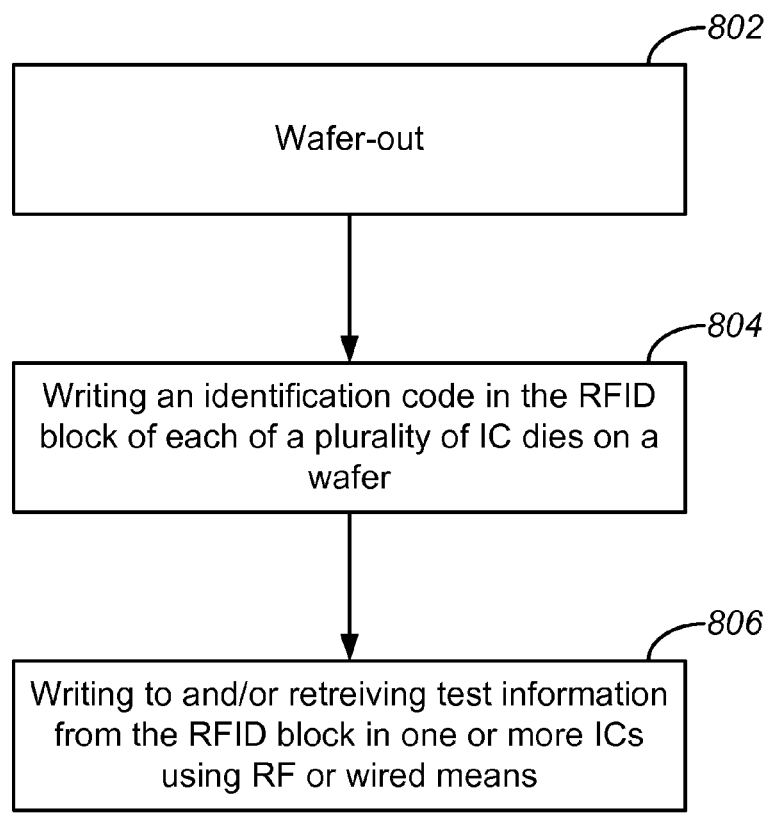
FIG. 8 is a flow chart depicting a method for information transfer between the RFID block embedded in an IC and an external source, in accordance with an embodiment of the invention.

FIG. 8 is a flow chart depicting a method for transferring information between the RFID block embedded in an IC and an external source, in accordance with an embodiment of the invention. After a wafer is fabricated, during wafer test, a unique chip identification code is stored in the RFID block of each die on the wafer via the test equipment and the interface unit of each RFID block. Other information such as the wafer lot to which the wafer under test belongs, the location of each die on the wafer, and the like can also be stored in the RFID block via the interface unit. This step is depicted by step 804. Note that once a unique ID code is stored in each die, all subsequent communications with the RFID block can be carried out wirelessly. Although, as a practical matter, in certain circumstances (e.g., during wafer test) it may be more feasible to exchange information with the RFID block using the wired resources (e.g., via the main circuit 102 and the interface unit 106 in FIG. 1).

In step 806, information relating to any subsequent tests which each die undergoes, such as the measured speed and power, results from temperature testing, and the like can be stored in the FeRAM of the RFID block via wireless communication through the RF capability of the RFID block or wired communication through the tester and the interface unit. The data stored in the RFID block may also be retrieved wirelessly using well known techniques at any time. Even after the packaged IC's leave the manufacturing site, information can be exchanged with each IC provided that the proper equipment for wireless communication is available.

Figure 9:
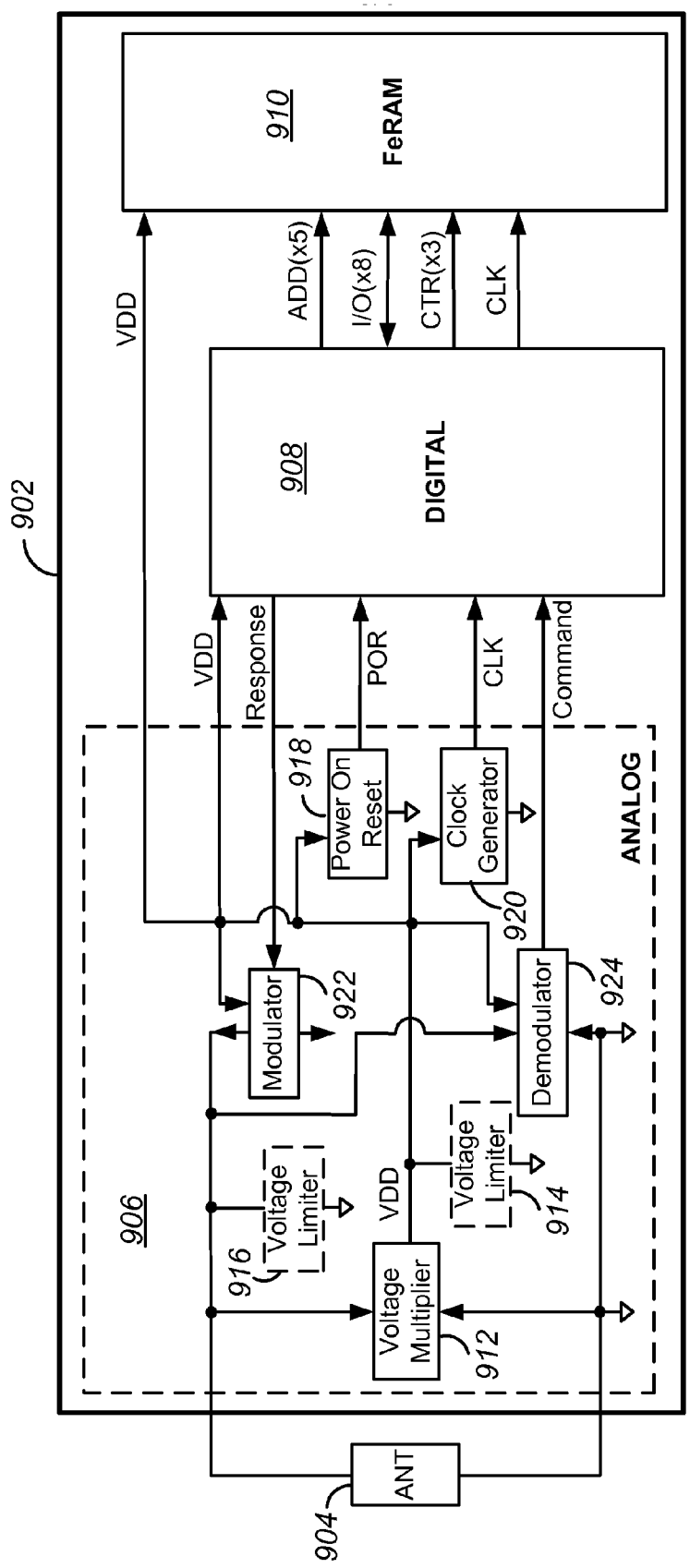
FIG. 9 is a block diagram showing an implementation of an RFID block embedded in an IC, in accordance with an embodiment of the present invention.

FIG. 9 is a block diagram showing an implementation of an RFID block 902 embedded in an IC such as those in FIGS. 1-7, in accordance with an embodiment of the present invention. The RFID block 902 in FIG. 9 includes a digital block 908 coupled between an analog block 906 and a FeRAM block 910. The analog block 906 includes an antenna circuit coupled to an antenna 904, e.g., the metal trace embedded in the IC, for sending data to and receiving data from an external reader/writer. A voltage multiplier 912 is configured to generate power VDD for the RFID block using the transmission frequency. A voltage limiter 916 is configured to limit a magnitude of the transmission voltage of a transmission frequency signal. A power on reset circuit 918 is configured to generate a RESET signal by detecting the RFID supply voltage VDD. A clock generator 920 is configured to generate a clock signal CLK coupled to digital block 908. A voltage doubler is configured to increase a voltage supplied to the FeRAM memory. A demodulator 924 is configured to detect operation command signals from the transmission frequency signal, and a modulator circuit 922 is configured to transmit requested information to the antenna.

Digital block 908 includes logic circuit and is in communication with analog block 906 via VDD, power on reset (POR), clock signal CLK, Response, and Command signals. Digital block 908 is in turn in communication with FeRAM 910 via address signals ADD(x5), I/O(x8) bus, control signals CTR(x3), and clock signal CLK. Analog block 906, digital block 908, and FeRAM 910 operate such that when a valid externally generated command signal is detected by RFID block 902, depending on the command, either information is retrieved from FeRAM 910 and then transmitted to an external source or information transmitted by an external source is stored in FeRAM 910.

Figures 10A, 10B:
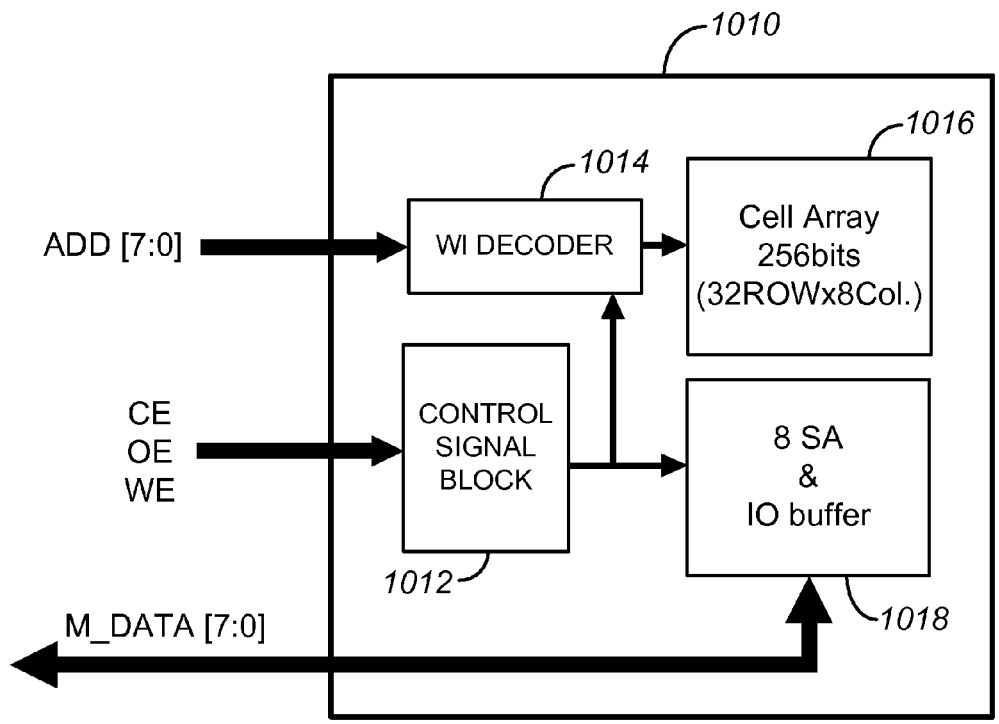
FIG. 10A is block diagram depicting a simplified exemplary architecture of the FeRAM block in FIG. 9.
FIG. 10B is a table indicating the function of each of the signals that are coupled to the FeRAM in FIG. 10A.

FIG. 10A is block diagram depicting a simplified exemplary architecture of FeRAM block 910 in FIG. 9. Address signals ADD[7:0] received from digital block 908 are coupled to a wordline (WL) decoder 1014 for selecting a row of cells in cell array 1016. A control signal block 1012 receives chip enable signal CE, read enable signal RE and write enable signal WE. When FeRAM 1010 is accessed, these signals indicate whether the memory access is a read access or a write access. Memory cell array 1016 has 256 cells arranged in 32 rows by 8 columns. In block 1018, the eight columns are coupled to eight sense amplifiers (SAs) which sense and amplify the signal corresponding to the selected cells. The eight columns and the sense amplifiers are coupled to eight I/O buffers through which data is transferred into or out of the array. Data read from FeRAM 1010 or to be stored in FeRAM 1010 is transferred via data signals M_DATA[7:0]. FIG. 10B is a table indicating the function of each of the signals that are coupled to FeRAM 1010 in FIG. 10A. Note that the present invention is not limited to the particular memory density or architecture shown in FIG. 10A. The array and its peripheral circuitry may be changed to implement a larger or smaller memory size than 256 bits depending on the design goals and the application. For example, larger memories with more columns of cells than those in FIG. 10A may be used. In such larger memory conventional column decoding may be used to select a subset of the columns. Many other features of conventional memories may also be implemented as necessary.

Figure 11:
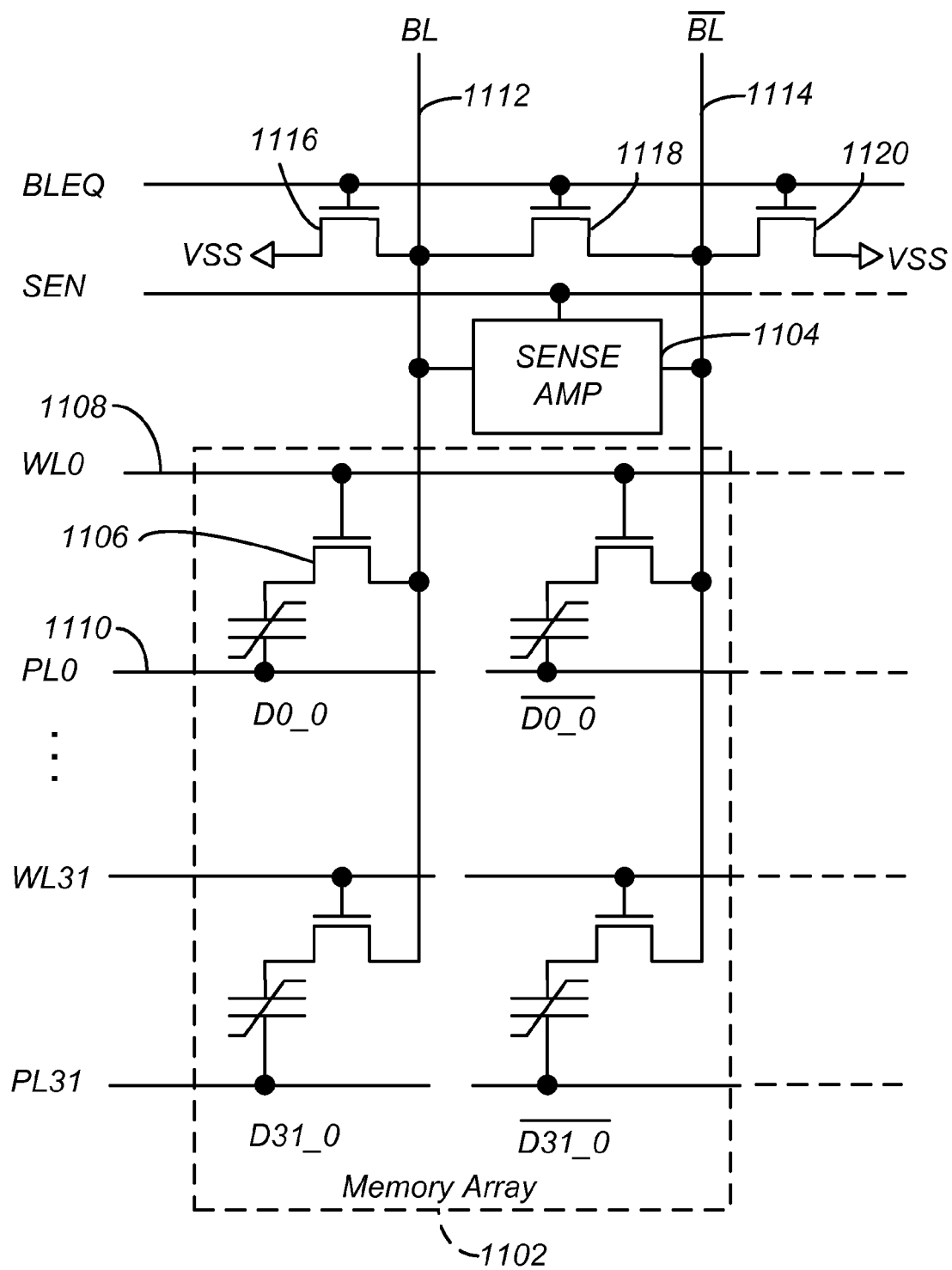
FIG. 11 is a circuit diagram showing an implementation of a portion of the cell array in FIG. 10A.

FIG. 11 is a circuit diagram showing an implementation of a portion of cell array 1016 in FIG. 10A. Cell array 1102 in FIG. 11 uses FeRAM memory cells 1106 arranged along rows and columns. A sense amplifier 1104 is coupled between each pair of BL 1112 and $\overline{BL}$ 1114 for sensing and amplifying the signal of a selected data bit. Transistors 1116, 1118, 1120 with their gates coupled to BLEQ serve to equalize the bitlines. As shown, each cell 1106 comprises a pass transistor and a FeRAM capacitor serially coupled between a vertically extending bitline and a horizontally extending plate line PL.

Cell 1106 will be used to describe write and read operations. In a write operation, wordline WL0 is raised high and if bitline BL is biased to a high voltage and plate line PL0 is biased to a low voltage (e.g., ground potential), then the cell capacitor is biased in logic 1 state. With wordline WL0 raised high, if bitline BL is biased to a low voltage (e.g., ground potential) and plate line PL0 is biased to a high voltage, then the cell capacitor is biased in logic 0 state. In a read operation, wordline WL0 is raised high, and if cell 1106 is biased in logic 1 state then a higher potential is developed on bitline BL, and if cell 1106 is biased in logic 0 state then a lower potential is developed on bitline BL. Once sufficient signal is developed on the bitlines, sense amplifier 1104 amplifies the developed signals to supply rails. Note that while memory array 1102 shows two-cells per bit configuration, one-cell per bit may be implanted using known techniques such as a reference voltage. Given the destructive nature of read 1 operation, a restore operation is carried out which is similar to the write operation described above.

Figure 12:
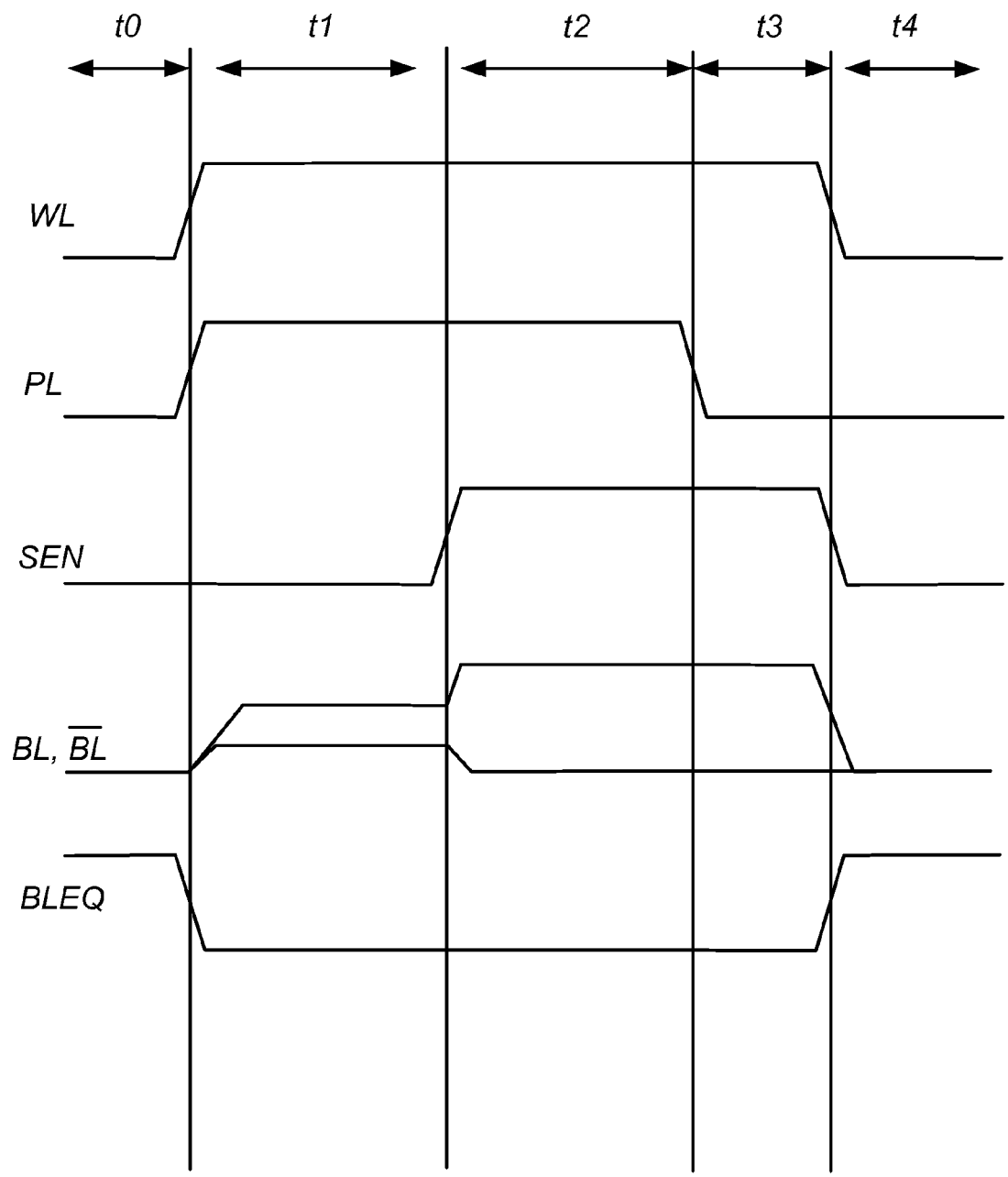
FIG. 12 is a timing diagram used to describe the operation of the FeRAM cell array in FIG. 11.

FIG. 12 is a timing diagram which will be used to describe in more detail operation of the FeRAM cell array 1102 in FIG. 11. During t0 and t4 the bitlines BL, $\overline{BL}$ are precharged via transistors 1116, 1118, 1120 which are turned on by BLEQ signal. A wordline WL is activated during t1, t2 and t3, and a plate line PL is activated during t1 and t2. Sense amp enable signal SEN is activated during t2 and t3, and BLEQ is activated during t0 and t4. At the end of t0 when bitline equalization is completed, signals corresponding to the selected cells start developing on the bitlines BL, $\overline{BL}$. At the end of time interval t1 when sufficient signal differential is developed on bit lines BL, $\overline{BL}$, signal SEN enables the sense amplifiers to amplify the signals on BL, $\overline{BL}$. After data of the BL, $\overline{BL}$ are amplified and transferred to I/O buffer, data 0 is restored during time interval t2, and data 1 is restored during time interval t3. The particular array configuration and corresponding timing diagrams are merely exemplary and not intended to be limiting. Other FeRAM cells and array configurations may be implemented in the RFID block of ICs, such as the dual gate FeRAM cells and corresponding array configurations disclosed in the commonly assigned patent application Ser. No. 11/433,753, titled "Dual-Gate Non-Volatile Ferroelectric Memory," filed on May 11, 2006, which disclosure is incorporated herein by reference in its entirety.

Figure 13:
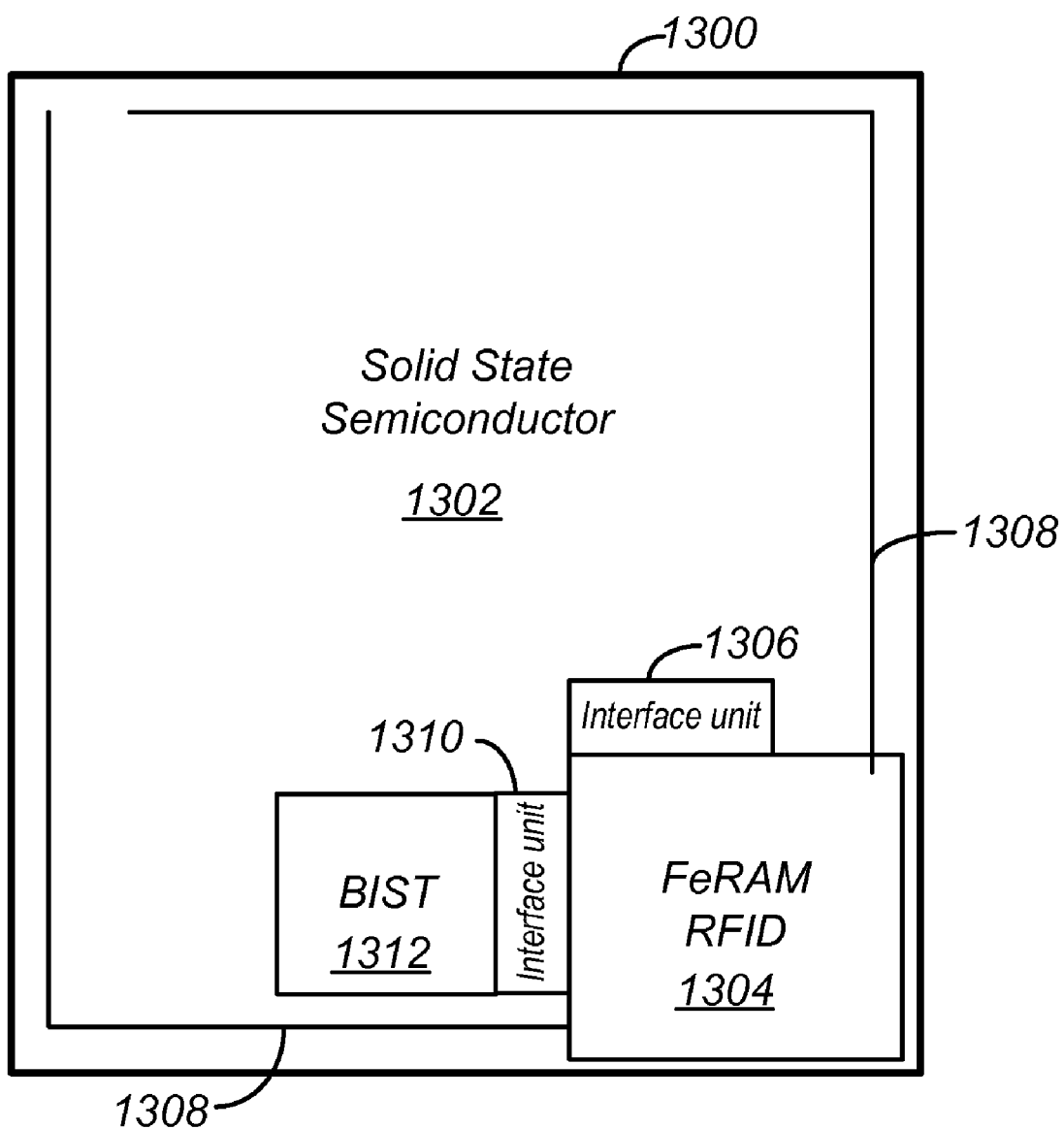
FIG. 13 is a top view diagram of a solid state semiconductor IC wherein BIST capability is advantageously integrated with embedded FeRAM-based RFID block in accordance with an embodiment of the invention.

FIG. 13 is a top view diagram of a solid state semiconductor IC wherein built-in self-test (BIST) capability is integrated with embedded FeRAM-based RFID block in accordance with an embodiment of the invention. BIST enables self test of the main circuit in the solid state semiconductor area 1302, and helps reduce test cost and complexities. The BIST functionality in combination with embedded RFID is particularly advantageous in that the BIST operation can be initiated wirelessly at any time, even after packaging the ICs.

In operation, command signals for initiating the BIST operation may be provided to RFID 1304 via RF signals or through the solid state semiconductor area 1302 and interface unit 1306. RFID block 1304 in turn generates control signals for initiating the BIST operation, and provides these control signals to BIST block 1312 via interface unit 1310. Upon completion of the BIST operation, part or all of the test results may be wirelessly retrieved by the manufacturer or the end-user via RFID block 1304. Also, all or part of the test results (e.g., key test results) may be stored in the FeRAM in the RFID 1304. Note that the implementation the BIST block 1312 depends on what function the IC 1300 performs, and as such BIST block 1312 needs to be tailored to the particular function IC 1300 performs. For example, if IC 1300 is a flash memory or a DRAM or a CPU, an appropriate one of a number of know BIST techniques can be implemented in block 1312 and appropriately interfaced with the main circuitry in region 1302.

Thus, in accordance with the present invention, a FeRAM-based RFID along with its RF antenna are embedded in various types of ICs used in electronic equipment such as computers, hand held devices, automobiles, appliances, and the like. The RFID embedded in ICs may be used for a variety of purposes including during the manufacturing process as described above. In one embodiment, the unique identification code stored in the RFID of each IC is used to track each IC for purposes of, for example, inventory assessment or distribution of ICs at a distribution center. By placing a reader at the distribution center, the flow of the ICs can be tracked. Additionally, electronic manufacturers such as PC board or computer manufacturers, can place a reader on each PC board or inside the housing of an electronic equipment to enable communication with the RFID of each IC.

In another embodiment, the RFID feature is configured to significantly improve the use efficiency of each IC. For example, in a memory IC such as a DRAM chip, in case of chip failure, the manufacturer or even the end user can use the RFID feature on the IC to identify the bad bits, e.g., by using the BIST feature, and disable the portion of the array in which the bad bits reside, thus allowing the remainder of the DRAM to be used for storage. In another embodiment, the RFID feature is configured to store information about the reliability of the part, thus allowing substantial improvement in quality control. ICs with less robust characteristics can be marked as such in their respective RFID block, and a user can retrieve this information and in turn use the IC in products which are not expected to be durable (e.g., in disposable cameras).

In accordance with yet another embodiment, the RFID embedded in ICs is configured to provide accessibility in the field. For example, when an IC at the user's site fails, the RFID feature can be used to identify the failing IC and the information forwarded to the manufacturer. The manufacturer can then pull up the information on the particular IC and use such information for yield improvement and the like. In yet another embodiment, the RFID embedded in each IC is configured to prevent theft of the IC in much the same way tags are used to prevent theft of clothing items from clothing stores. In other embodiment, BIST functionality is advantageously integrated with the RFID feature in an IC to enable testing of ICs even after the packaged IC leaves the manufacturing site.

While the above provides a detailed description of various embodiments of the invention, many alternatives, modifications, and equivalents are possible. For this and other reasons, therefore, the above description should not be taken as limiting the scope of the invention as defined by the claims.

What is claimed is:

1. An integrated circuit (IC) die comprising:
 a high capacitance solid state circuit region configured to perform predetermined operations;
 an RFID block configured for wireless communication with an external source, the RFID block being further configured to generate an internal BIST command in response to an external command received by the RFID block directly through the high capacitance solid state circuit region; and
 a built-in self-test (BIST) block coupled to carry out testing of the high capacitance solid state circuit region in response to the internal BIST command,
 wherein the RFID block is configured to store information relating to the testing,
 wherein the RFID block is further configured to enable wireless retrieval of the test results from the testing of the high capacitance solid state circuit region.

2. The IC die of claim 1 wherein the high capacitance solid state circuit region comprises one or more of DRAM, Flash memory, FeRAM, CPU, system on chip (SoC), and ASIC.

3. The IC die of claim 1 further comprising a BIST interface unit coupled between the RFID block and the BIST block, the BIST interface unit being configured to transmit the internal BIST command from the RFID block to the BIST block.

4. The IC die of claim 1 further comprising a conductive trace extending through predetermined regions of the IC die, the conductive trace being configured as an antenna for the RFID block, wherein the RFID block is configured to receive and transmit information to an external source via the antenna.

5. The IC die of claim 1 further comprising an interface unit configured to transfer to the RFID block an externally-provided unique ID for wirelessly identifying the IC die.

6. The IC die of claim 5 wherein the RFID block comprises an FeRAM block configured to store the unique ID.

7. The IC die of claim 5 wherein the interface unit is further configured to enable communication between the RFID block and the high capacitance solid state circuit region.

8. The IC die of claim 1 wherein the RFID block is configured to store information relating to the testing via wireless communication and wired communication.

9. The IC die of claim 1 further comprising an interface unit configured to allow data transfer to or from the RFID block via IC pins.

* * * * *